United States Patent
Xiang et al.

(10) Patent No.: US 11,087,062 B1
(45) Date of Patent: Aug. 10, 2021

(54) DYNAMIC SADP REGION GENERATION

(71) Applicant: International Business Machines Corporation, Armonk, NY (US)

(72) Inventors: Hua Xiang, Ossining, NY (US); Gi-Joon Nam, Chappaqua, NY (US); Gustavo Enrique Tellez, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/936,146

(22) Filed: Jul. 22, 2020

(51) Int. Cl.
*G06F 30/392* (2020.01)
*G06F 30/398* (2020.01)
*G06F 30/373* (2020.01)
*G06F 30/394* (2020.01)

(52) U.S. Cl.
CPC .......... *G06F 30/392* (2020.01); *G06F 30/373* (2020.01); *G06F 30/394* (2020.01); *G06F 30/398* (2020.01)

(58) Field of Classification Search
CPC .............................. G06F 30/392; G06F 30/398
USPC ....................................................... 716/119
See application file for complete search history.

(56) References Cited

U.S. PATENT DOCUMENTS

| | | | |
|---|---|---|---|
| 9,147,653 B2 | 9/2015 | Yuan et al. | |
| 9,524,362 B2 * | 12/2016 | Wang | G03F 7/70466 |
| 9,633,987 B2 | 4/2017 | Smayling et al. | |
| 9,659,125 B2 | 5/2017 | de Dood | |
| 9,659,138 B1 | 5/2017 | Powell et al. | |
| 9,659,818 B1 | 5/2017 | Clevenger et al. | |
| 9,747,407 B2 * | 8/2017 | Choi | G03F 7/70 |
| 9,811,626 B2 | 11/2017 | Jeong | |
| 9,971,250 B2 * | 5/2018 | Tung | G03F 1/70 |
| 10,796,064 B2 * | 10/2020 | Xiang | G06F 30/392 |
| 2008/0227295 A1 * | 9/2008 | Chen | H01L 21/76816 438/691 |
| 2015/0052490 A1 * | 2/2015 | Cilingir | G03F 1/36 716/52 |

(Continued)

OTHER PUBLICATIONS

Sorin Dobre et al., "Mixed cell-height implementation for improved design quality in advanced nodes." Proceedings of the IEEE/ACM International Conference on Computer-Aided Design, Nov. 2015, pp. 854-860.

(Continued)

*Primary Examiner* — Suchin Parihar
(74) *Attorney, Agent, or Firm* — Erik Johnson; Michael J. Chang, LLC

(57) ABSTRACT

Techniques for dynamically generating self-aligned double patterning (SADP) gate regions based on gate distribution and the relocation of the gates to their matched region are provided. In one aspect, a method for generating SADP gate regions in a circuit design includes: obtaining a circuit design having SADP gates, and a placement solution for the SADP gates that, while non-overlapping, violates SADP track routing matching requirements; determining approximate locations of SADP regions in the circuit design; assigning the SADP gates to the SADP regions using a minimum-cost maximum-flow (min-cost max-flow) process; and identifying, once all of the SADP gates have been assigned to the SADP regions, non-overlapping locations for the SADP gates in the SADP regions.

20 Claims, 6 Drawing Sheets

(56) References Cited

U.S. PATENT DOCUMENTS

| | | | | |
|---|---|---|---|---|
| 2015/0286771 | A1* | 10/2015 | Choi | G03F 1/70 |
| | | | | 716/51 |
| 2020/0013879 | A1* | 1/2020 | Li | H01L 29/6653 |
| 2020/0057836 | A1* | 2/2020 | Xiang | G06F 30/392 |
| 2020/0134125 | A1* | 4/2020 | Huang | H01L 23/528 |

OTHER PUBLICATIONS

Yibo Lin et al., "Detailed placement in advanced technology nodes: a survey," 13th IEEE International Conference on Solid-State and Integrated Circuit Technology (ICSICT), Oct. 2016, pp. 836-839.
Anonymous, "Methodology to improve SADP metal routability for lower technology nodes," IP.com, IPCOM000252144D, Dec. 18, 2017, 5pp.
W. Gillijns et al., "Impact of a SADP flow on the design and process for N10/N7 metal layers," Proc. of SPIE vol. 9427, 942709, Mar. 2015, 9 pp.

* cited by examiner

DYNAMIC SADP REGION GENERATION

FIELD OF THE INVENTION

The present invention relates to placement of self-aligned double patterning (SADP) gates in a circuit design, and more particularly, to techniques for dynamically generating SADP gate regions in a circuit design based on gate distribution and relocation of the gates to their matched region.

BACKGROUND OF THE INVENTION

Self-aligned double patterning (SADP) is a pitch-multiplying technique employed in integrated circuit manufacturing. For instance, an SADP process can be employed in the patterning of metal gate lines in semiconductor field-effect transistor (FET) device designs at a scaled pitch.

In the 7 nanometer (nm) technology node, SADP gates with thick metals are added to the design library for better performance, such as a reduced resistance, faster signal transmission, etc. For instance, multiple types of gates might exist in a 7 nm library such as 7 weight (W) gates, 5 W gates, 3 W gates, 7-5 W gates, 5-3 W gates, 7-5-3 W gates, etc.

However, employing SADP gates with thick metals can present some notable challenges. For instance, placement constraints are imposed on the design which dictate where the 7 W/5 W/3 W gates can be placed on the matched circuit regions. With designs containing multiple types of gates, the task of meeting these placement constraints becomes increasingly more difficult.

Thus, efficient and effective techniques for SADP gate placement in circuit designs containing 7 W/5 W/3 W gates would be desirable.

SUMMARY OF THE INVENTION

The present invention provides techniques for dynamically generating self-aligned double patterning (SADP) gate regions based on gate distribution and the relocation of the gates to their matched region. In one aspect of the invention, a method for dynamic SADP region generation is provided. The method includes: obtaining a circuit design having SADP gates, and a placement solution for the SADP gates that, while non-overlapping, violates SADP track routing matching requirements; determining approximate locations of SADP regions in the circuit design; assigning the SADP gates to the SADP regions using a minimum-cost maximum-flow (min-cost max-flow) process; and identifying, once all of the SADP gates have been assigned to the SADP regions, non-overlapping locations for the SADP gates in the SADP regions.

A more complete understanding of the present invention, as well as further features and advantages of the present invention, will be obtained by reference to the following detailed description and drawings.

DETAILED DESCRIPTION OF PREFERRED EMBODIMENTS

Figure 1A:
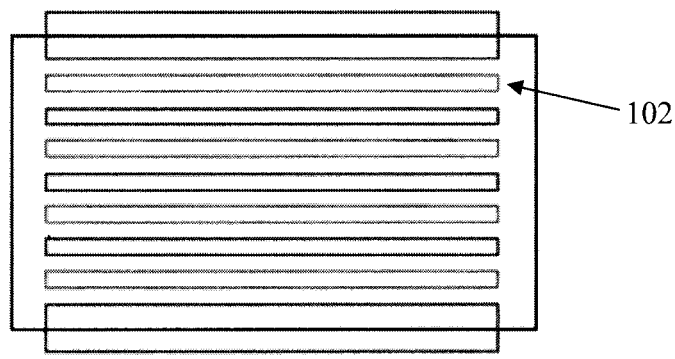
FIG. 1A is a diagram illustrating a 7 W library cell type where only a minimum width wire can be used.
Figure 1B:
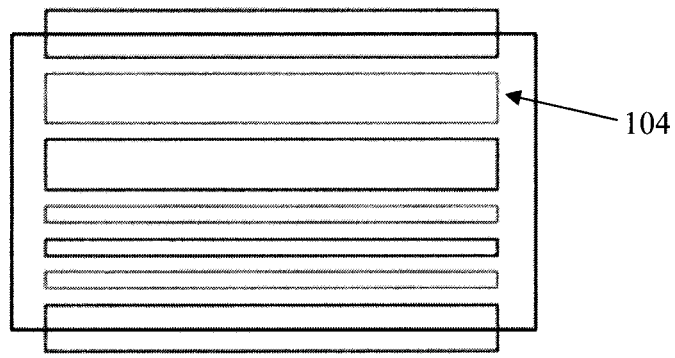
FIG. 1B is a diagram illustrating a 5 W library cell type where a ~2× width wire can be used.
Figure 1C:
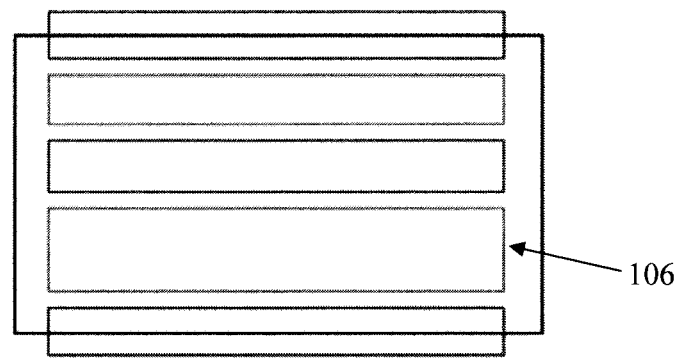
FIG. 1C is a diagram illustrating a 3 W library cell type where a ~3× width wire can be used according to an embodiment of the present invention.

As provided above, self-aligned double patterning (SADP) gates with thick metals are added to the design library in the 7 nanometer (nm) node for better performance, such as reduced resistance, faster signal transmission, etc. Multiple cell types are available in a 7 nm library such as 7 weight (W) gates, 5 W gates, 3 W gates, 7-5 W gates, 5-3 W gates, 7-5-3 W gates, etc. For instance, FIG. 1A illustrates a 7 W library cell type where only a minimum width wire 102 can be used, FIG. 1B illustrates a 5 W library cell type where a ~2× width wire 104 can be used, and FIG. 1C illustrates a 3 W library cell type where a ~3× width wire 106 can be used. A library cell with 5 W and/or 3 W types has stronger drive strength so it is better for performance. However, in order to use 5 W and/or 3 W cells, the corresponding wiring has to be available in that region (see below).

Advantageously, the present techniques provide a unique three-stage iterative flow for dynamically creating 7 W/5 W/3 W SADP gate regions in a circuit design based on gate distributions. The 7 W/5 W/3 W SADP gates are then relocated to their matched regions. Namely, as will be described in detail below, an integer linear programming (ILP)-based process is first used to calculate the rough/approximate locations of the 5 W/3 W SADP gate regions. Artificial regions are added to address the dilemma that the ILP process cannot return a partial solution if it fails, thus guaranteeing that an ILP solution, or a partial solution will be returned.

A min-cost max-flow-based process is then used to assign invalid gates to matched regions. Instead of sticking to a pre-calculated region capacity, a unique capacity redistribution process is used to host more gates.

Finally, a linear programming (LP)-based row legalization process is used to determine region boundaries and gate locations. Advantageously, the formulation minimizes gate location changes. The process is iterated until there is convergence of the SADP assignment. By way of the present process, an efficient three-stage iterative SADP gate region generation and placement scheme is presented. The iteration guarantees convergence of the flow.

As highlighted above, the present techniques are performed against a backdrop of an SADP-based process being used in the production of the 7 W/5 W/3 W gate lines. It is notable that with this SADP-based process, thicker wires are pre-embedded at specific locations in a pre-manufactured chip layout (track routing). Thus, when making placement decisions, one cannot simply pick any wire at an arbitrary location in the layout to make thicker 5 W/3 W gate lines. Instead, one has to adopt the placement along the pre-manufactured wires thereby matching the SADP track routing.

The inputs to the process are i) a circuit design having mixed SADP (7 W/5 W/3 W) library cell types, and ii) a conventionally legal placement solution for the cells that, while non-overlapping, violates the SADP routing track matching requirements. For instance, with a traditional placement solution, all cells are treated the same (e.g., it is assumed that all gate types are 7 W) and simply placed on the chip without any overlay. Here, however, the placement of mixed SADP library cell types is performed, and thus 7 W, 5 W, 3 W, etc. regions need to be created which match the SADP track routing requirements. A non-overlapping placement of the cells is also referred to herein as a 'legal' placement, and the process for resolving overlaps is also referred to herein as 'legalization.'

The outputs from the process are i) dynamically created SADP (7 W/5 W/3 W) regions, and ii) relocated (5 W/3 W) gate types that now match the SADP track routing, whereby fixed structures in the design such as shuddle structures are kept untouched. As is known in the art, a shuddle is a structure that has a group of latches and Large Clock Buffers (LCBs) placed next to each other and forms a regular shape (e.g., a rectangular shape) for timing benefits. The objective of the process is to minimize the gate location changes as much as possible by keeping the new placement solution as close to the previous one. Thus, advantageously, the present process can take any conventionally legal (non-overlapping) cell placement solution and produce an SADP-legal placement solution matching SADP track routing constraints with minimal perturbations to the starting placement solution.

Figure 2:
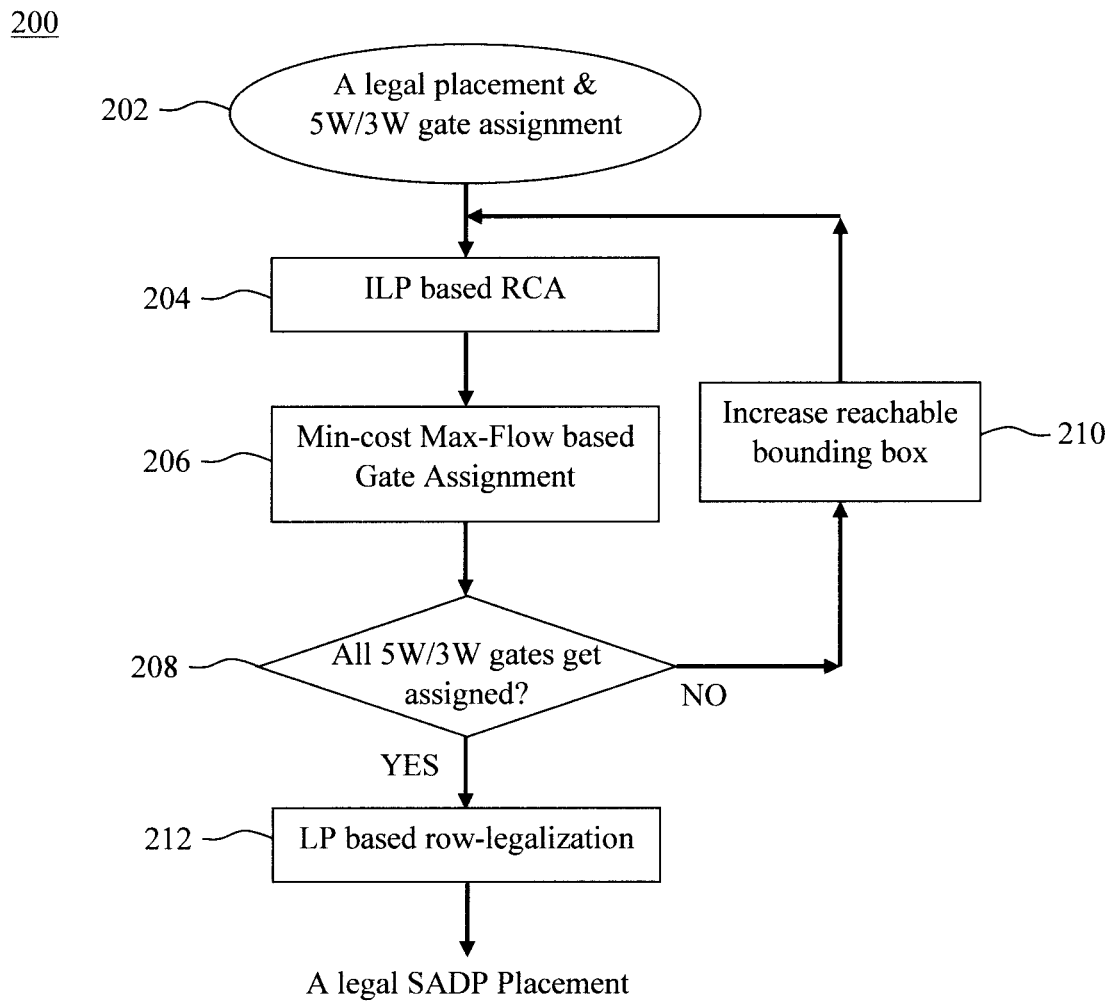
FIG. 2 is a diagram illustrating an exemplary methodology for dynamic self-aligned double patterning (SADP) gate region generation according to an embodiment of the present invention.

Given the above overview, FIG. 2 is a diagram illustrating an exemplary methodology 200 for dynamic SADP region generation in accordance with the present techniques. In step 202, as highlighted above, the input to the present process is a traditionally legal (i.e., non-overlapping) placement solution and assignment of mixed SADP (5 W/3 W) cell gate types. According to an exemplary embodiment, the majority of the gate types are still 7 W (see above), and thus the process focuses on (SADP legal) placement of the 5 W and 3 W new gate types.

In step 204, an integer linear programming (ILP) based region candidate SADP assignment (RCA) is used to determine the approximate (rough) location of each region in the circuit design for placement of the 3 W and 5 W gate types, i.e., 3 W/5 W SADP regions. The remainder of the SADP regions are assumed to be 7 W SADP regions (see above). The 3 W/5 W SADP regions are determined at the placement step. Namely, a general physical synthesis flow includes floorplan followed by placement, clock tree synthesis, and then routing. The present strategy is to first get an initial, normal placement which assumes all gates are 7 W. Based on the initial placement, some regions for 3 W and 5 W gates are identified. A new placement which has 3 W/5 W regions to host 3 W/5 W gates is then created. As will be described in detail below, the ILP-based RCA involves determining the available segments in each row of the circuit design based on the locations of fixed structures in the design (which are kept untouched), partitioning the available segments into SADP region candidates based on (e.g., user-determined) segment length, and then determining the SADP type (7 W/5 W/3 W) of each SADP region candidate.

Now that it is known which SADP region candidates are 5 W/3 W SADP type, in step 206 the 5 W and 3 W gate types are assigned to the newly identified 3 W and 5 W SADP regions (from step 204) using a minimum-cost maximum-flow (min-cost max-flow) process. Use of a min-cost max-flow process minimizes the perturbations in the placement solution. Namely, the min-cost max-flow process is a graph process which is used to assign gates to their compatible regions. By setting a cost on edges to reflect gate location change, this process can minimize the total local changes. Also, each region has a capacity, i.e., the number of gates that can fit in that region. The min-cost max-flow process can handle this constraint as well. As will be described in detail below, the min-cost max-flow process involves using a flow network for SADP region assignment and, as long as the capacity between fixed structures can accommodate all the gates assigned to an SADP region, the 5 W and 3 W gate types are moved (from their position in the input placement solution—see step 202 above) to that assigned SADP region.

A determination is then made in step 208 as to whether all of the 5 W and 3 W gate types have been assigned to a 3 W or 5 W SADP region. If it is determined (NO) that, based on the min-cost max-flow process (from step 206), that there are unassigned 3 W/5 W gates (i.e., 3 W/5 W gates unmatched to an SADP region) then in step 210 the reachable bounding box is increased, e.g., by increasing the x-range and row-range of the bounding box. Steps 204-208 are then repeated in an iterative manner until all of the 5 W and 3 W gate types have been assigned to matched regions.

Once it is determined (YES) that all of the 5 W and 3 W gate types have been assigned to a 3 W or 5 W SADP region, then in step 212 a linear programming (LP)-based row-legalization process is performed to determine gate locations and 7 W/5 W/3 W SADP region bounds. The result is a legal SADP placement process with minimal gate location changes keeping the new placement solution as close as possible to the original input placement solution (see step 202 above). As will be described in detail below, once all of the 5 W and 3 W gate types have been assigned to their matched SADP region overlapping may still exist, thus the LP based row-legalization process is applied along each circuit row to get the optimized locations of the gates and region bounds.

As described in conjunction with the description of step 204 of methodology 200 above, an ILP based RCA process is used to determine the approximate (rough) location of each 3 W/5 W SADP region in the circuit design, with the remainder of the SADP regions assumed to be 7 W SADP regions. Details of this ILP based RCA process are now provided.

Figure 3:
FIG. 3 is a diagram illustrating a circuit row having been cut into available segments by fixed structures according to an embodiment of the present invention.

Fixed structures in the circuit design cannot be moved and cut each circuit row into segments. Based on the location of the fixed structures, available segments can be identified. See, for example, FIG. 3. As shown in FIG. 3, fixed structures Fix1, Fix2 and Fix3 cut circuit row 302 into segments Seg1, Seg2 and Seg3. Thus, in this example, segments Seg1, Seg2 and Seg3 are available segments.

Figure 4:
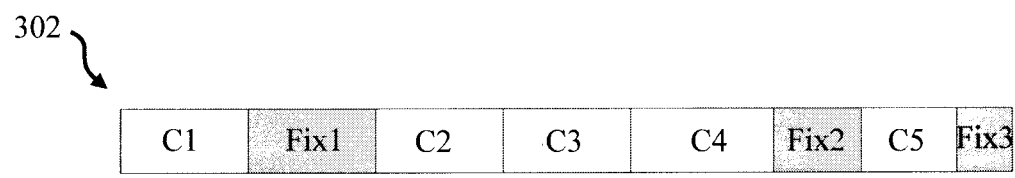
FIG. 4 is a diagram illustrating the available segments having been partitioned into region candidates based on segment length according to an embodiment of the present invention.

Each of the available segments (e.g., Seg1, Seg2 and Seg3) is then partitioned into region candidates based on segment length. See, for example, FIG. 4. As shown in FIG. 4, following partitioning row 302 has region candidates C1, C2, C3, C4 and C5. In this example, Seg2 has been partitioned into multiple region candidates (e.g., region candidate segments C2, C3 and C4). However, based on the chosen segment length, available segments Seg1 and Seg3 can each only accommodate one region candidate, i.e., region candidates C1 and C5, respectively. According to an exemplary embodiment, the segment length is defined by a user. For instance, segment length=100 placement tracks (the value can be specified by a user). In other words, if the segment is long, then the segment is divided into several 100-track segments.

This partitioning process is performed along all rows of a circuit design to create a map of region candidates. See, for example, an exemplary map 502 of region candidates shown in FIG. 5. In map 502, the region candidates C are identified by row and position x within that row (row, x). For instance, the first region candidate in Row 1 of the circuit design is designated as $C_{1,1}$, the second region candidate in Row 1 is designated as $C_{1,2}$, and so on.

Given the map of region candidates, region candidate assignment (RCA) is then used to determine approximate locations of the 3 W/5 W SADP regions. For instance, according to an exemplary embodiment, RCA involves determining the SADP type (7 W/5 W/3 W) of each region candidate such that each 3 W/5 W gate (g) can reach a 3 W/5 W region candidate within a given row_range and x_range. To look at it another way, gate (g) can only be assigned to the region candidates that fall within the given row_range and x_range. For instance, referring to the example depicted in FIG. 5, bounding box 504 illustrates a given region candidate row_range and x_range. As provided above, each region candidate is identified by its row and its position x in that row. Bounding box 504 provides a row and position x range for the region candidates in map 502. According to an exemplary embodiment, the region candidate row_range and x_range (as illustrated by bounding box 504) is defined by the user. In other words, the user-defined row_range and x_range (as illustrated by bounding box 504) identifies those regions amongst all of the region candidates (shown for example in map 502) that are candidates for assignment of 3 W or 5 W gate types. For instance, by way of example only, a row_range=2 and x_range=100 placement tracks means that a gate can move up or down by two rows, or left or right no more than 100 tracks. These two parameters are used to control the gate movement. In other words, a gate should not be moved too far away from its original location. These two parameters work on each gate. For instance, for each gate, treat the gate as the center, then create a rectangle that defines the movement range of this gate. The rectangle size is determined by row_range and x_range. By default, all gates are 7 W (i.e., in previous technology all gates are the same type, therefore there are no region issues), and 5 W and 3 W gates are the newly introduced gates. Accordingly, some regions are identified and adjusted to place 5 W/3 W gates. If not explicit stated, the gates/regions are for 7 W.

Figure 5:
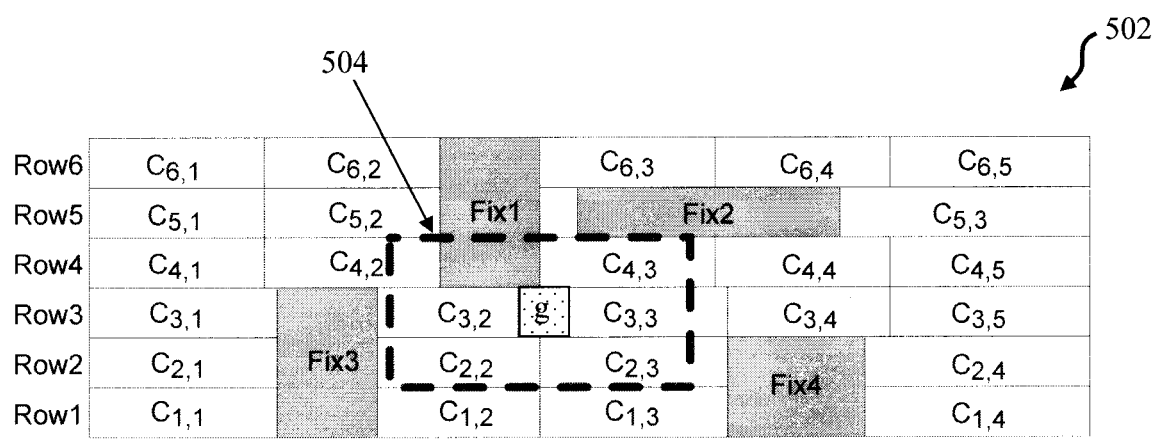
FIG. 5 is a diagram illustrating a map of the region candidates having been created with a user-defined row_range and x_range bounding box that identifies those regions amongst all of the region candidates that are candidates for assignment of SADP gates according to an embodiment of the present invention.

In the example shown in FIG. 5, 3 W or 5 W gate types (g) can only be assigned to the region candidates within the bounding box. i.e., region candidates $C_{4,2}$, $C_{4,3}$, $C_{3,2}$, $C_{3,3}$, $C_{2,2}$, and $C_{2,3}$. An integer linear programming (ILP) formulation is then used to determine the SADP type for each of the region candidates in the map 502. For instance, using the example in FIG. 5, ILP is used to identify region $C_{3,2}$ as a 3 W region candidate or to identify region $C_{3,2}$ as a 3 W region candidate, etc. The remainder of the SADP regions are assumed to be 7 W SADP regions (see above).

Based on this ILP based RCA process, some of the region candidates are defined as 5 W SADP type regions, some of the region candidates (e.g., within the user-defined row_range and x_range bounding box 504) are defined as 3 W SADP type regions, and so on. As described in conjunction with the description of step 206 of methodology 200 above, the 5 W and 3 W gates are then moved to these newly identified 3 W and 5 W SADP regions using a minimum-cost maximum-flow (min-cost max-flow) process. Min-cost max-flow is generally a well-known graph problem. Details of this min-cost max-flow process in accordance with the present techniques are now provided.

Figure 6:
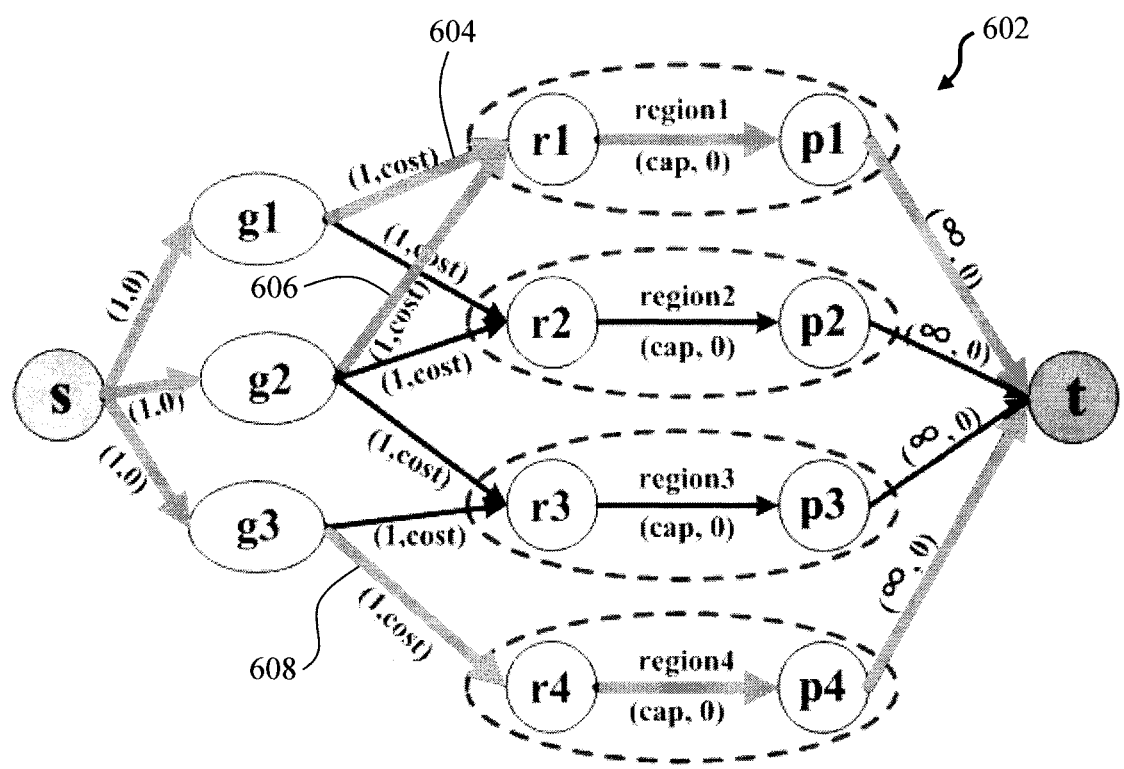
FIG. 6 is a diagram illustrating an exemplary flow network for SADP gate assignments using a min-cost max-flow process according to an embodiment of the present invention.

According to an exemplary embodiment, a flow network is constructed for these 3 W and 5 W gate type assignments. See, for example, exemplary flow network 602 shown in FIG. 6, where each 3 W and 5 W gate is a node in the flow network. The min-cost max-flow process ensures that all of the 3 W and 5 W gates are not assigned to the same region. The capacity (cap) of a given region is the maximum number 3 W and 5 W gates that given region can hold. For instance, in the example shown in FIG. 6 at the start (S) of the process there are three 3 W and 5 W gates (generically labeled as g1, g2 and g3) that can be assigned to 4 region candidates (r1, r2, r3 and r4).

Applying the min-cost max-flow process, three of the flows are pushed. Namely, as indicated by arrows 604 and 606 the assignment of gates g1 and g2 are pushed to region candidate r1 and, as indicated by arrow 608 the assignment of gate g3 is pushed to region candidate r4. Thus, the process terminates (T) with gates g1 and g2 being assigned to region candidate 1 (r1) and gate g3 being assigned to region candidate 4 (r4).

More specifically, for flow network 602 the input graph treats all edges the same, i.e., all are dark thin arrows. On each edge, there is one pair of numbers (capacity, cost). The flow starts from S. In this example, three flows are pushed at Node S, and the flows find paths until they reach Node t. When pushing the flow, the flow on each edge cannot exceed its capacity, and the target is to find all flow paths (as indicated by the gray thick edges) with the min-cost. For some cases, not all flows can be pushed through to Node t. For example, if four flows are pushed from S, then one flow cannot reach t due to capacity constraint. This is why the problem is called min-cost max-flow. But the min-cost max-flow process is always able to identify the maximum flow to the Node t.

The goal of this process is to assign gates to regions. The gates are represented by nodes g1, g2, and g3. The regions are illustrated as four ellipses with dashed outlines. Each region is represented by a pair of nodes. For example, region1 is represented by r1→p1. This is because each region has a capacity constraint, but nodes do not have a capacity feature. Instead, edges can have a capacity feature. Thus, we use two nodes r1 and p1 and create an edge in between them. In this way, the region capacity can be assigned to the edge (r1, p1).

As described in conjunction with the description of step 208 of methodology 200 above, a determination is then made as to whether the min-cost max-flow process results in all of the 5 W and 3 W gate types have been assigned to a 3 W or 5 W SADP region. If not, and there are unmatched 3 W/5 W gates, then the user-defined row_range and x_range bounding box can be increased, and the process repeated in an iterative manner until all of the 5 W and 3 W gate types have been assigned to matched regions. Here, the user need only define row_range and x_range, e.g., row_range=2 and x_range=100—see above. In that case, the increasing step can be row_increase=2 and x_increase=200. For each iteration, the bounding box becomes larger such that the gate has a better chance to find a compatible location, while users only need specify these 4 parameters. Alternatively, default values can be used in lieu of the user-defined parameters.

For gates, the goal is to minimize their location changes as much as possible. So, at the very beginning, the bounding box is small. If a solution is found, it stops. If not, the searching space has to get increased, i.e., a bigger bounding box.

Once all of the 5 W and 3 W gate types have been assigned to matched regions, it is notable that the exact locations of the gates within the assigned regions is still unknown. Namely, with the min-cost max-flow process as long as the capacity between fixed structures can hold all of the assigned gates, then those gates can be assigned to the matched region. However, overlap may exist.

Figure 7:
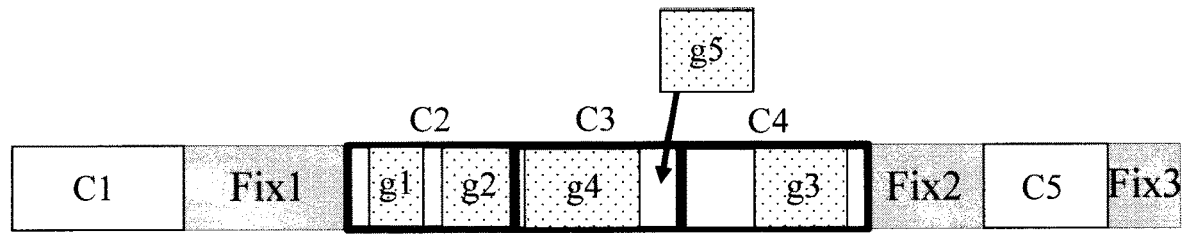
FIG. 7 is a diagram illustrating a scenario where a region candidate cannot host matched gates without some overlap according to an embodiment of the present invention.
Figure 8:
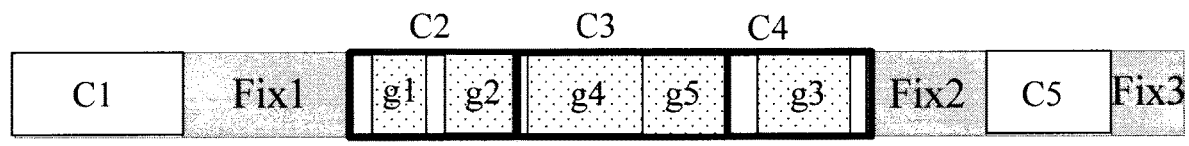
FIG. 8 is a diagram illustrating the boundaries of region candidate having been adjusted to permit placement of all of the SADP gates according to an embodiment of the present invention.

Thus, the region boundaries can be adjusted to fit all of the assigned gates. See, for instance, the illustrative example shown in FIG. 7. As shown in FIG. 7, C1, C2, C3, C4 and C5 are region candidates. Gates g1 and g2 have been assigned to region candidates C2, gates g4 and g5 have been assigned to region candidate C3, and gate g3 has been assigned to region candidate C4. However, region candidate C3 cannot host both of the matched gates g4 and g5 without some overlap. By shrinking the boundaries of region candidate C4, all gates g1-g5 can be placed. This legalization process is applied along each row of the circuit design. See FIG. 8.

As described in conjunction with the description of step 212 of methodology 200 above, a linear programming (LP)-based row-legalization process is performed to determine the optimized locations of the gates and region bounds. Details of this LP-based row-legalization process are now provided. The target of the LP-based row-legalization process is to minimize the total gate movement, i.e., $$\min(\Sigma_{j=1}^{M_i} \Sigma_{k=1}^{N_{i,j}} |x_{g_{i,j}^k}^{new} - x_{g_{i,j}^k}^{old}|).$$

According to an exemplary embodiment, the following Region constraints for Row i are imposed:

$$chip_{xlow} \le x_{i,1}^L$$

$$x_{M_i}^H \le chip_{xhigh}$$

$$x_{i,j}^H = Fill + x_{i,j+1}^L \ (j=1 \ldots M_i-1)$$

$x_{i,j}^L = Region_L$ and $x_{i,j}^H = Region_H$ if Region is fixed

The following Gate constraints for Row i are imposed:

$$x_{g_{i,j}^k}^{new} + W_{g_{i,j}^k} \le x_{g_{i,j}^{k+1}}^{new}$$

$$x_{i,j}^L \le x_{g_{i,j}^1}^{new}$$

$$x_{g_{i,j}^{N_{i,j}}}^{new} \le x_{i,j}^H$$

Figure 9:
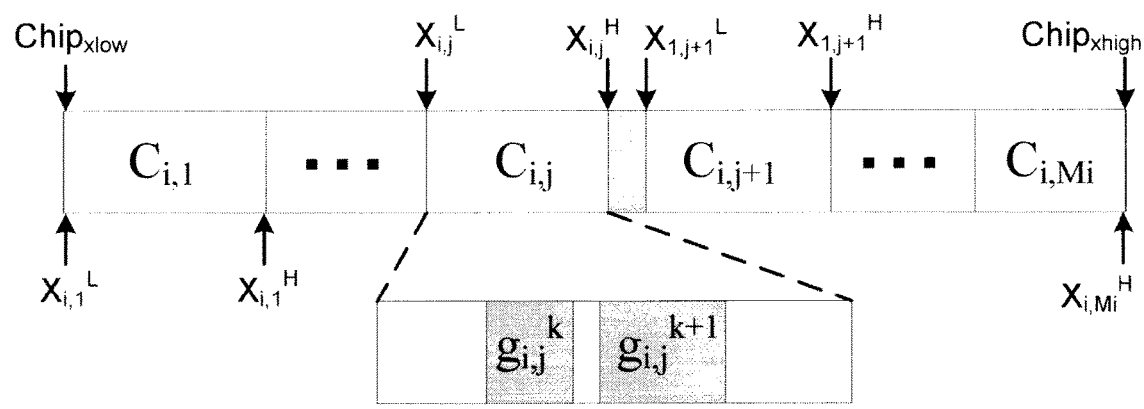
FIG. 9 is a diagram illustrating region and gate constraints for a linear programming (LP)-based row-legalization process according to an embodiment of the present invention.

See, also, FIG. 9 which illustrates these region and gate constraints for the LP-based row-legalization process.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 10:
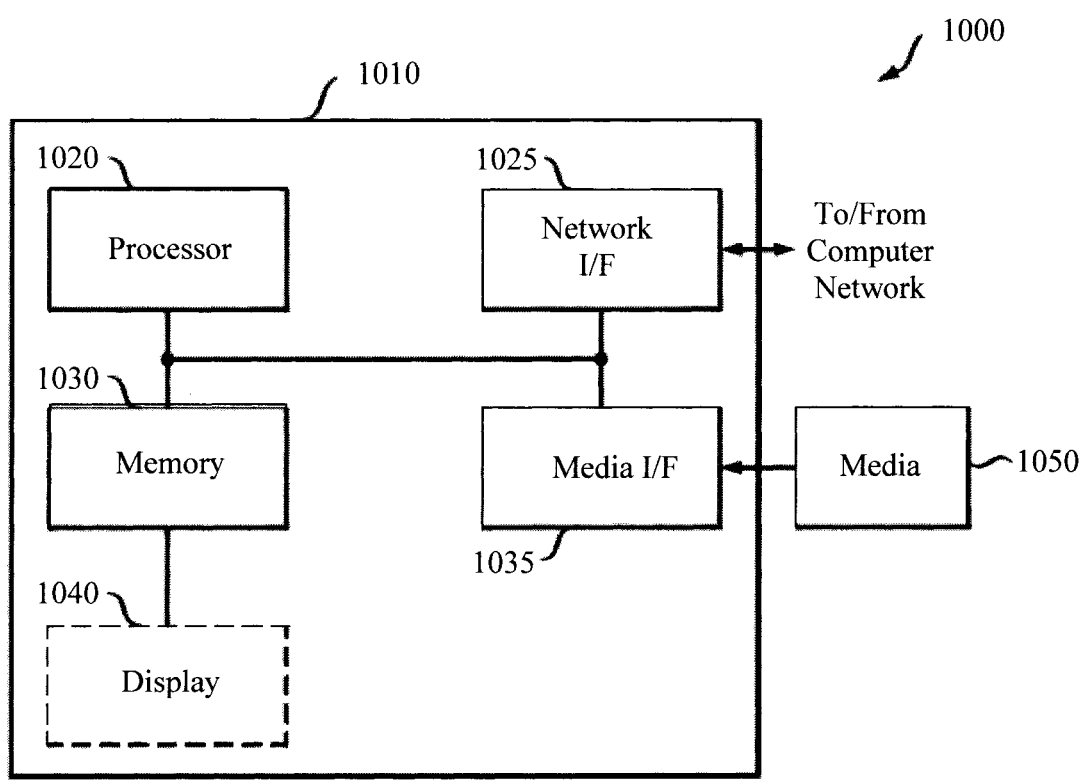
FIG. 10 is a diagram illustrating an exemplary apparatus for performing one or more of the methodologies presented herein according to an embodiment of the present invention.

Turning now to FIG. 10, a block diagram is shown of an apparatus 1000 for implementing one or more of the methodologies presented herein. By way of example only, apparatus 1000 can be configured to implement one or more of the steps of methodology 200 of FIG. 2.

Apparatus 1000 includes a computer system 1010 and removable media 1050. Computer system 1010 includes a processor device 1020, a network interface 1025, a memory 1030, a media interface 1035 and an optional display 1040. Network interface 1025 allows computer system 1010 to connect to a network, while media interface 1035 allows computer system 1010 to interact with media, such as a hard drive or removable media 1050.

Processor device 1020 can be configured to implement the methods, steps, and functions disclosed herein. The memory 1030 could be distributed or local and the processor device 1020 could be distributed or singular. The memory 1030 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1020. With this definition, information on a network, accessible through network interface 1025, is still within memory 1030 because the processor device 1020 can retrieve the information from the network. It should be noted that each distributed processor that makes up processor device 1020 generally contains its own addressable memory space. It should also be noted that some or all of computer system 810 can be incorporated into an application-specific or general-use integrated circuit.

Optional display 1040 is any type of display suitable for interacting with a human user of apparatus 1000. Generally, display 1040 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method, comprising:
obtaining a circuit design having self-aligned double patterning (SADP) gates, and a placement solution for the SADP gates that, while non-overlapping, violates SADP track routing matching requirements based on pre-embedded wires at specific locations in a pre-manufactured chip layout;
determining approximate locations of SADP regions in the circuit design;
assigning the SADP gates to the SADP regions using a minimum-cost maximum-flow (min-cost max-flow) process; and
identifying, once all of the SADP gates have been assigned to the SADP regions, non-overlapping locations for the SADP gates in the SADP regions.

2. The method of claim 1, wherein the SADP gates comprise 7 W, 5 W and 3 W gates.

3. The method of claim 1, wherein the approximate locations for the SADP regions in the circuit design are determined using integer linear programming (ILP) based region candidate SADP assignment (RCA), and wherein the method further comprises:
determining available segments in each row of the circuit design based on locations of fixed structures in the circuit design.

4. The method of claim 3, further comprising:
partitioning the available segments into region candidates; and
determining an SADP type of each of the region candidates.

5. The method of claim 4, wherein the SADP type of each of the region candidates comprises 7 W SADP type, 5 W SADP type or 3 W SADP type.

6. The method of claim 4, wherein the available segments are partitioned into the region candidates based on segment length.

7. The method of claim 6, wherein the segment length is defined by a user.

8. The method of claim 4, wherein the partitioning is performed along all rows of the circuit design to create a map of the region candidates.

9. The method of claim 8, further comprising:
defining a row_range and position x range (row_range and x_range) of the region candidates in the map for assignment of the SADP gates.

10. The method of claim 9, wherein the row_range and x_range is defined by a user.

11. The method of claim 9, wherein there are unassigned SADP gates, and wherein the method further comprises:
increasing the row_range and x_range.

12. The method of claim 1, further comprising:
adjusting at least one of the SADP regions to fit all of the SADP gates that have been assigned to the at least one SADP region without overlap.

13. A non-transitory computer program product comprising a computer readable storage medium having program instructions embodied therewith, the program instructions executable by a computer to cause the computer to:
obtain a circuit design having SADP gates, and a placement solution for the SADP gates that, while non-overlapping, violates SADP track routing matching requirements based on pre-embedded wires at specific locations in a pre-manufactured chip layout;
determine approximate locations of SADP regions in the circuit design;
assign the SADP gates to the SADP regions using a min-cost max-flow process; and
identify, once all of the SADP gates have been assigned to the SADP regions, non-overlapping locations for the SADP gates in the SADP regions.

14. The non-transitory computer program product of claim 13, wherein the approximate locations for the SADP regions in the circuit design are determined using ILP based RCA, and wherein the program instructions further cause the computer to:
determine available segments in each row of the circuit design based on locations of fixed structures in the circuit design.

15. The non-transitory computer program product of claim 13, wherein the program instructions further cause the computer to:
partition the available segments into region candidates; and
determine an SADP type of each of the region candidates.

16. The non-transitory computer program product of claim 15, wherein the available segments are partitioned into the region candidates based on segment length.

17. The non-transitory computer program product of claim 14, wherein the available segments are partitioned into the region candidates along all rows of the circuit design to create a map of the region candidates.

18. The non-transitory computer program product of claim 17, wherein the program instructions further cause the computer to:
define a row range and position x range (row_range and x_range) of the region candidates in the map for assignment of the SADP gates.

19. The non-transitory computer program product of claim 18, wherein there are unassigned SADP gates, and wherein the program instructions further cause the computer to:
increase the row_range and x_range.

20. The non-transitory computer program product of claim 13, wherein the program instructions further cause the computer to:
adjust at least one of the SADP regions to fit all of the SADP gates that have been assigned to the at least one SADP region without overlap.

* * * * *